US006359768B1

(12) United States Patent
Eversley et al.

(10) Patent No.: US 6,359,768 B1
(45) Date of Patent: Mar. 19, 2002

(54) PLANAR SHIELD WITH HIGH DENSITY, INTERLEAVED CONTACTS FOR GROUNDING ELECTROMAGNETIC EMISSIONS

(75) Inventors: Courtney Cleophas Eversley, Durham; Walter Adrian Goodman, Raleigh, both of NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/480,555

(22) Filed: Jan. 10, 2000

(51) Int. Cl.[7] .......................... H05F 1/00; H01R 13/648
(52) U.S. Cl. ........................................ 361/212; 439/497
(58) Field of Search ................................ 361/212, 604, 361/704, 726, 683; 174/35 R, 52.1, 35 GC; 439/579, 607, 92, 497

(56) References Cited

U.S. PATENT DOCUMENTS

| | | | | |
|---|---|---|---|---|
| 4,508,415 A | * | 4/1985 | Bunnell | 439/497 |
| 5,726,866 A | * | 3/1998 | Allen | 361/816 |
| 5,748,455 A | * | 5/1998 | Phillips et al. | 361/818 |
| 5,774,337 A | * | 6/1998 | Lee et al. | 361/725 |
| 6,123,582 A | * | 7/1999 | Ko et al. | 439/579 |
| 6,227,879 B1 | * | 12/1999 | Dong | 439/2 |
| 6,047,172 A | * | 4/2000 | Babineau et al. | 455/300 |

* cited by examiner

Primary Examiner—Peter S. Wong
Assistant Examiner—Pia Tibbits
(74) Attorney, Agent, or Firm—George E. Grosser; Andrew Dillon

(57) ABSTRACT

A shield for resisting the passage of electromagnetic emissions in a computer is formed from a rectangular plate having apertures for receiving various electrical connectors that insert into the computer. Each aperture in the plate has grounding members for engaging the connectors. The plate also has a row of spring-like wiping members along each of the four side edges. Two edges of the plate each have a single row of wiping members, and two edges of the plate have two opposed rows of wiping members. The opposed rows are interposed with each other in an alternating sequence. One of the two opposed rows forms a series of folds, and the other row forms a series of tabs. The shield is mounted to the side edge flanges of a rectangular opening in the wall of the computer. Two of the flanges slidingly engage the single row of wiping members. The other two flanges insert into the folds and contact with both the folds and the tabs. After the shield is installed, the computer cables and connectors are inserted through the apertures and interconnected with the computer. As the cables and connectors move, the double-row wiping members allow the shield to float in the computer opening while maintaining electrical grounding contact with all four of its flanges.

18 Claims, 3 Drawing Sheets

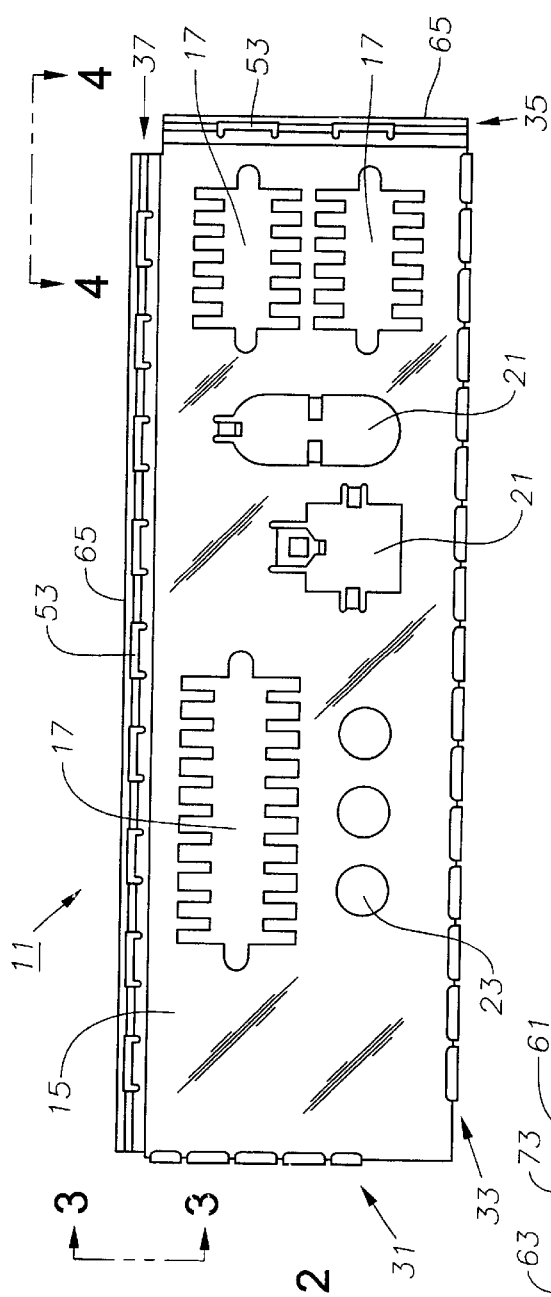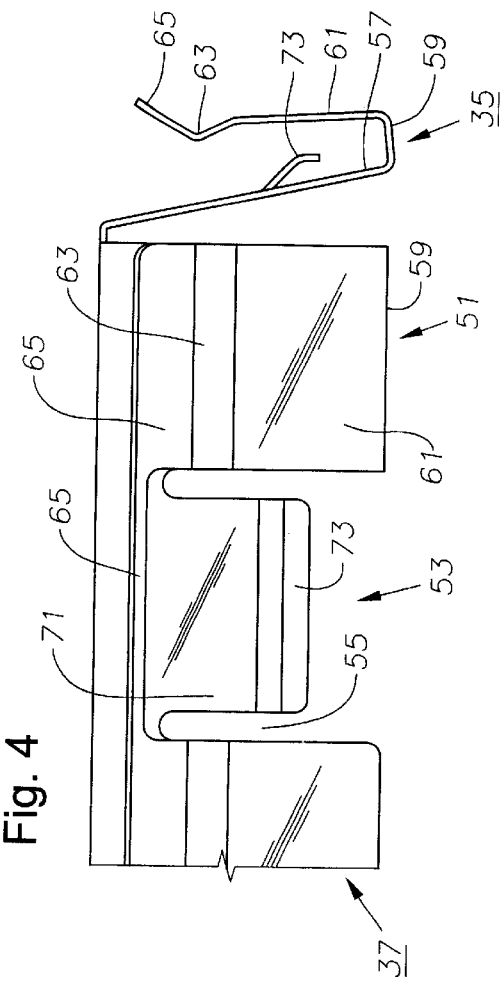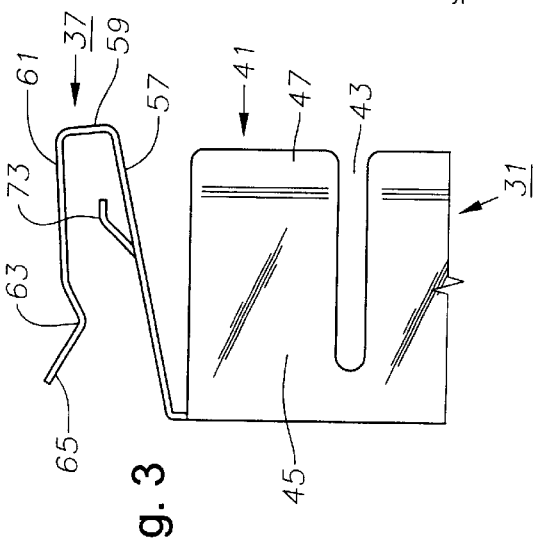

PLANAR SHIELD WITH HIGH DENSITY, INTERLEAVED CONTACTS FOR GROUNDING ELECTROMAGNETIC EMISSIONS

BACKGROUND OF THE INVENTION

1. Technical Field:

This invention relates in general to controlling electromagnetic emissions and in particular to a planar shield with high density contacts for grounding both input and output high speed circuit electromagnetic emissions.

2. Description of Related Art:

The ever-increasing speed of modern computer processors or CPUs has given rise to increased electromagnetic interference (EMI) emissions. As a result, the need to develop better techniques and procedures for controlling EMI has also increased to keep pace with U.S. and European emission regulations.

In the prior art, high speed circuit electromagnetic emissions are typically eliminated or reduced via a direct ground connection which allows a return path for the high speed signals. The return paths are generally located close to the point of origin to reduce the length of the return paths, and to reduce the amount of radiating surface area that can release the emissions. In the prior art, radiating signals between the source and ground have been suppressed through spring clips or conductive gaskets. As long as the processors remain close to the motherboard they were attached to, EMI reductions involving spring clips were not needed.

However, with the advent of ultra high speed processors, improved EMI reduction techniques are needed. This need is compounded by the fact that the heatsinks used to cool the processors are the primary source of the CPU's radiated energy and emissions. Since the heatsinks are typically free-floating (i.e. not attached to the system planar board), the emissions are free to radiate throughout the system and out of the system enclosure. Thus, an improved system for grounding the EMI emissions of high speed processors is needed.

SUMMARY OF THE INVENTION

A shield for grounding input and output electromagnetic emissions in a computer is formed from a rectangular plate having apertures for receiving various electrical connectors that insert into the computer. Each aperture in the plate has grounding members for engaging the connectors. The plate also has a row of spring-like wiping members along each of the four side edges. Two edges of the plate each have a single row of wiping members, and two edges of the plate have two opposed rows of wiping members. The opposed rows are interposed with each other in an alternating sequence. One of the two opposed rows forms a series of folds, and the other row forms a series of tabs.

The shield is mounted to the side edge flanges of a rectangular opening in the wall of the computer. Two of the flanges slidingly engage the single row of wiping members. The other two flanges insert into the folds and contact with both the folds and the tabs. After the shield is installed, the computer cables and connectors are inserted through the apertures and interconnected with the computer. As the cables and connectors move, the double row wiping members allow the shield to float in the computer opening while maintaining electrical grounding contact with all four of its flanges.

BRIEF DESCRIPTION OF THE DRAWINGS

So that the manner in which the features, advantages and objects of the invention, as well as others which will become apparent, are attained and can be understood in more detail, more particular description of the invention briefly summarized above may be had by reference to the embodiment thereof which is illustrated in the appended drawings, which drawings form a part of this specification. It is to be noted, however, that the drawings illustrate only a preferred embodiment of the invention and is therefore not to be considered limiting of its scope as the invention may admit to other equally effective embodiments.

FIG. 2 is a front view of the shield of FIG. 1.

FIG. 3 is an enlarged partial side view of the shield of FIG. 1 taken along the line 3—3 of FIG. 2.

FIG. 4 is an enlarged partial top view of the shield of FIG. 1 taken along the line 4—4 of FIG. 2.

BEST MODE FOR CARRYING OUT THE INVENTION

Figure 1:
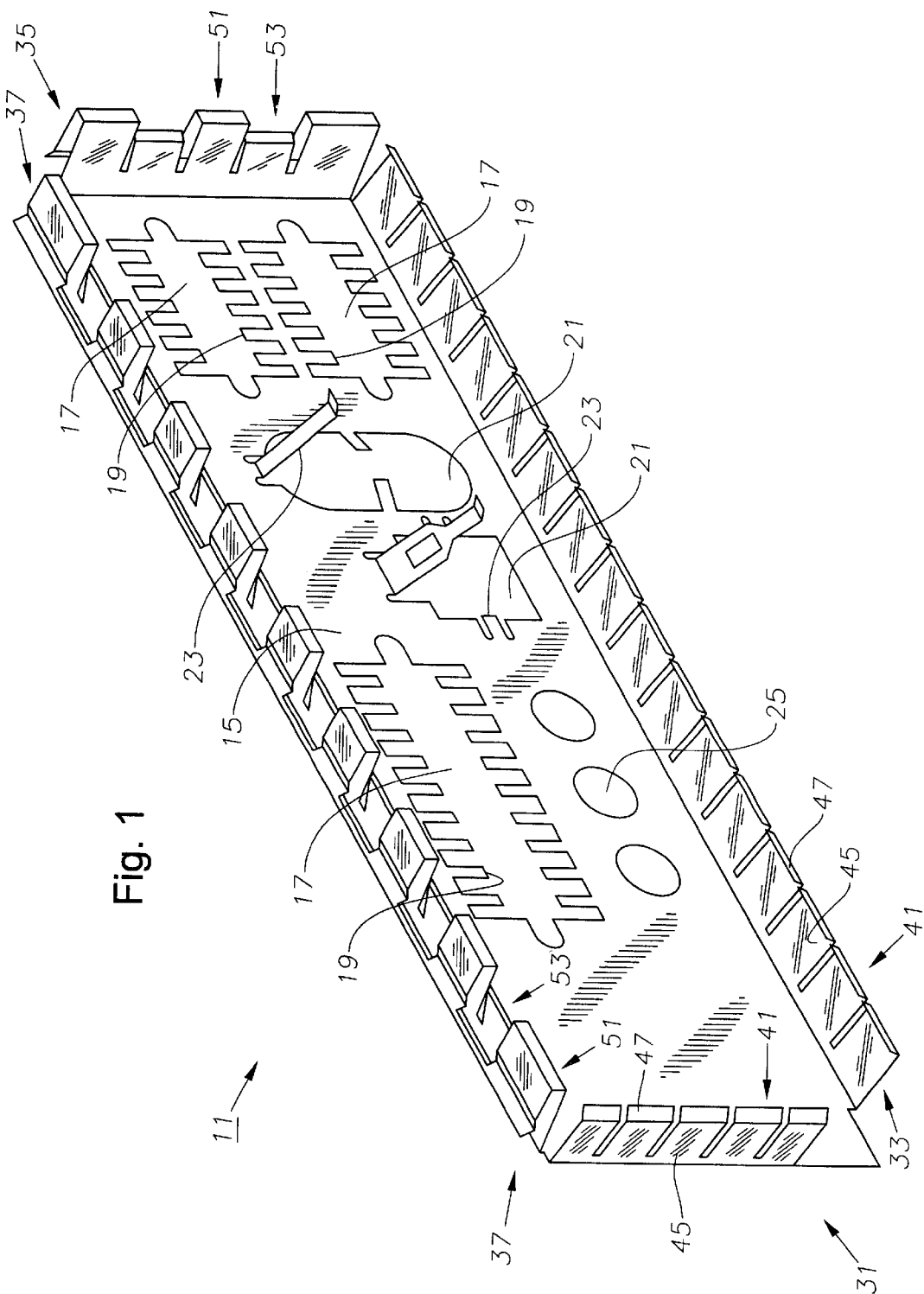
FIG. 1 is an isometric view of a shield constructed in accordance with the invention.
Figure 5:
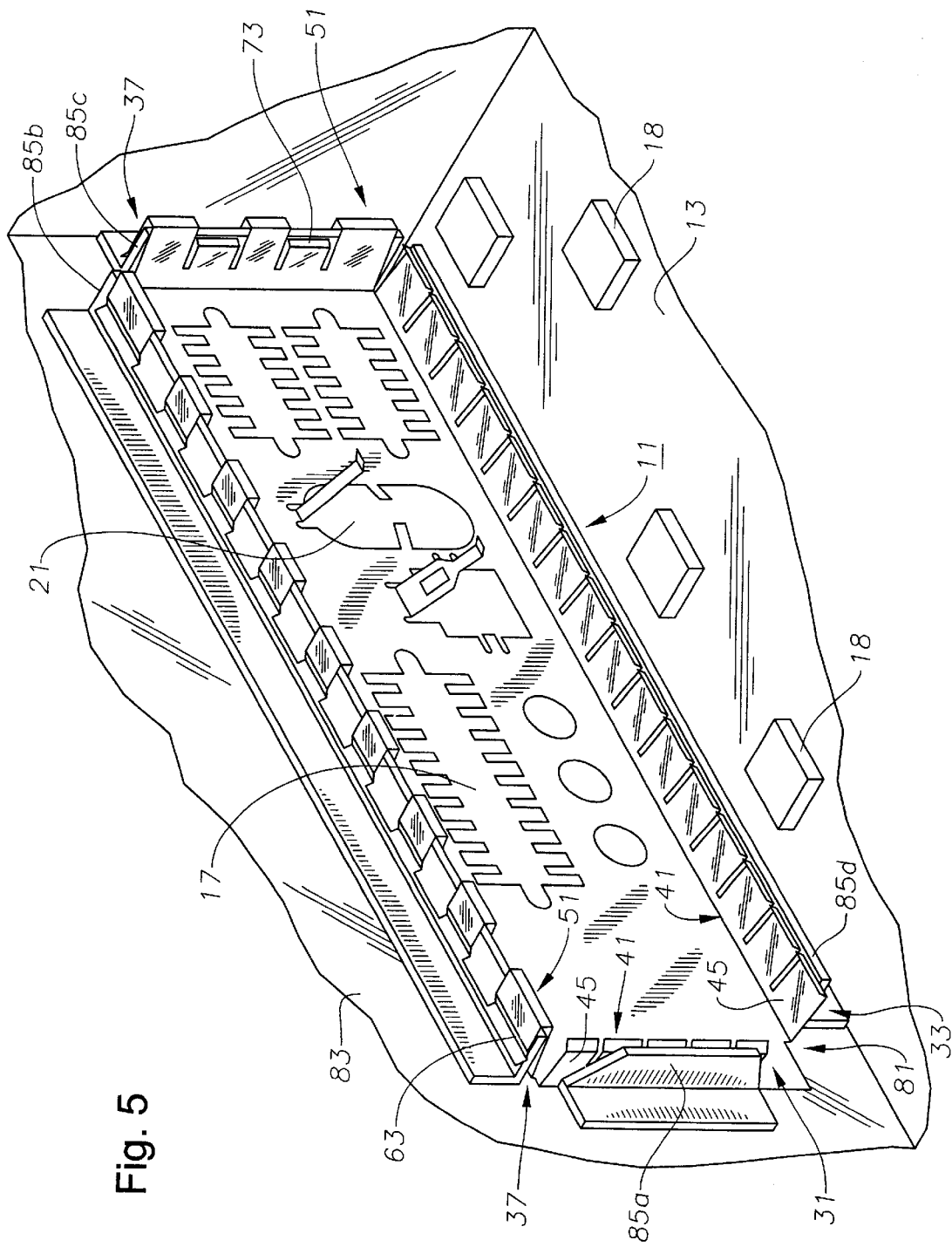
FIG. 5 is an enlarged partial side view of the shield of FIG. 1 taken along the line 5—5 of FIG. 2 .

Referring to FIG. 1, a substantially planar, metallic shield 11 for grounding input and output electromagnetic emissions in a computer device 13 (FIG. 5) is shown. Shield 11 has a thin plate 15 that is generally rectangular in shape. Plate 15 contains a plurality of openings that are provided for receiving various electrical connectors which insert into the computer device 13. The openings in plate 15 include horizontally disposed apertures 17 with grounding or wiping members 19, vertically disposed apertures 21 with wiping members 23, and other orifices 25. Wiping members 19, 23 are spring-like devices that protrude generally inward from their respective apertures 17, 21. Wiping members 19, 23 are also inclined at an acute angle relative to the plane defined by plate 15 to maintain resilient but compliant contact with the outer surfaces of the connectors when they are inserted into apertures 17, 21. Apertures 17, 21, their respective wiping members 19, 23, and orifices 25 may be provided in many different shapes, sizes and locations other than those illustrated, depending upon the particular requirements of computer device 13.

Shield 11 also comprises a row of spring-like grounding clips along each of the four perimetrical edges of plate 15. In the embodiment shown, the left side and bottom edges of plate 15 have single-row clips 31, 33, respectively, and the right side and top edges of plate 15 have double-row clips 35, 37, respectively. Alternatively, a rectangular shield 11 may also be formed with three or four edges of the double-row clips, and one or no edges with single-row clips, respectively. Single-row clips 31, 33 are substantially identical to each other in function and geometry except for their lengths. Likewise, double-row clips 35, 37 are very similar to each other except for their lengths.

As shown in FIGS. 1 and 3, each single-row clip 31, 33 has a plurality of parallel, finger-like wiping members 41 that are spaced apart from each other by narrow slits 43 (FIG. 3). Each wiping member 41 comprises a rectangular flange 45 with a tab 47 on its distal end. Note that flanges 45 are not quite perpendicular to plate 15, but are oriented at a small acute angle away from plate 15 (FIG. 1). The tabs 47 on the ends of flanges 45 curve or bend back toward the interior of plate 15 at a larger acute angle.

Referring to FIGS. 3 and 4, each double-row clip 35, 37 comprises a first series of wiping members 51 that is interleaved with an opposed second series of wiping members 53 in an alternating fashion. The individual wiping members 51, 53 are spaced apart from each other by slits 55. Each wiping member 51 in the first series has a generally folded or C-shaped cross-section defined by a linear base portion 57, a turned shoulder 59 at the end of base portion 57, a return portion 61, and a V-shaped contact 63 on the end of return portion 61 that terminates into a tab 65. Base portions 57 are not perpendicular to plate 15, but are oriented at a small acute angle away from the interior of plate 15. Return portions 61 extend in the opposite direction to base portions 57, but are approximately parallel thereto. The ridges on V-shaped contacts 63 point toward base portions 57 while tabs 65 deflect away from base portions 57. Wiping members 51 are joined together at their tabs 65 (FIGS. 1, 2, and 4) which extend contiguously along the lengths of the top and right edges of plate 15.

Each wiping member 53 in the second series has a somewhat S-shaped cross-section and comprises a rectangular flange 71 with a tab 73 on its distal end (see FIGS. 1, 3, and 4). Flanges 71 are approximately parallel to base portions 57 of wiping members 51. When viewed from the side, tabs 73 on the ends of flanges 71 terminate between base portions 57 and return portions 61 of wiping members 51.

In operation (FIG. 5), shield 11 is mounted in a rectangular opening 81 in computer device 13. Opening 81 is formed in the enclosure or sheet metal wall 83 of computer device 13. Opening 81 has short, inward-turned flanges 85a, 85b, 85c, 85d along its four side edges. Flanges 85a, 85d at the left side and bottom edges of opening 81 are slidingly engaged by single-row clips 31, 33, respectively. Alternatively, one or more of the edges of opening 81 may be provided without a flange 85. For example, flange 85d at the bottom edge of opening 81 could be removed such that single-row clip 33 directly engages the bottom edge of opening 81. Since wiping members 41 of clips 31, 33 depend outward toward flanges 85a, 85d, a tight, interference fit is achieved therebetween. The outer surfaces on flanges 45 of wiping members 41 maintain contact with flanges 85a, 85d.

The top and right side flanges 85b, 85c are inserted into double-row clips 37, 35, respectively. As shown in FIGS. 8 and 9, flanges 85b, 85c slide into the C-shaped cross-section of wiping members 51 to maintain contact with both V-shaped contacts 63 of wiping members 51, and tabs 73 of wiping members 53. Wiping members 51, 53 pinch or grip flanges 85b, 85c between them to maintain a tight fit. Note that wiping members 51 may also be formed into other shapes or profiles as well, such as a V-shaped profile, that would prevent a sheared edge on shield 11 from grabbing frame 13. If wiping members 51 did not have such a profile, a sheared edge on shield 11 would cause problems if and when shield 11 was removed from frame 13.

After shield 11 is installed and computer device 13 is operational, computer cables and connectors (not shown) may be inserted through apertures 17, 21 and electrically interconnected with various electronic, information processing means and components 18 in computer device 13. As the cables and connectors are attached, detached, or otherwise moved, the double-row clips 35, 37 allow shield 11 to "float" somewhat in opening 81, both vertically and horizontally, while maintaining electrical grounding contact with flanges 85.

The invention has several advantages. The opposed wiping members in the double-row clips of the shield provide superior electrical contact, mechanical resilience, and compliance over conventional single-row clips. The double-row clips maintain a constant, nominal, repetitive interference contact between the sheet metal frame, the shield, and the connectors. The lengths of the opposed wiping members are designed to accommodate variations in the tolerances of the various components. The shield locks onto the frame such that movement from the various computer cables and connectors do not cause intermittent EMI contact between them. This design provides an adequate return path for electrical current to prevent common mode noise from radiating between the frame and shield. It also improves the surface contact resistance, reduces inductance between the metal parts, and ensures a shortened circuit path for the high frequency return currents between the contacting surfaces.

While the invention has been shown or described in only some of its forms, it should be apparent to those skilled in the art that it is not so limited, but is susceptible to various changes without departing from the scope of the invention.

What is claimed is:

1. A computer, comprising in combination:
    an enclosure having a wall that is electrically conductive;
    an opening in the wall of the enclosure, the opening having a perimeter and a perimeter flange with two surfaces protruding from the perimeter;
    electronic means located within the enclosure for processing information;
    an electromagnetic shield mounted to the opening for resisting the passage of electromagnetic emissions; the electromagnetic shield comprising:
        a plate that is electrically conductive covering the opening, the plate having a side edge and a plurality of connector apertures, wherein each of the connector apertures is adapted to receive an external electrical connector for interconnection with the electronic means in the enclosure; and
        a set of spring-like, opposed tabs extending from the side edge, the tabs defining a slot that receives the perimeter flange via insertion and grips both surfaces of the perimeter flange, wherein the tabs accommodate translation of the plate when the electrical connectors are inserted into and removed from the connector apertures while maintaining electrical continuity along both surfaces of the perimeter flange.

2. The computer of claim 1 wherein the opening has a second perimeter flange opposite said perimeter flange, and the plate has a second side edge opposite said side edge; and further comprising:
    a second set of tabs on the second side edge of the plate, each of the second set of tabs engaging the second perimeter flange and maintaining electrical continuity therewith.

3. The computer of claim 1 wherein the tabs have distal and proximal ends and wherein the tabs are electrically interconnected to each other on both their distal and proximal ends.

4. The computer of claim 1 wherein the tabs comprise different types of contacts that are arranged in an interleaved, alternating pattern to form the set of tabs.

5. The computer of claim 4 wherein one of the two types of contacts has a folded profile that defines the slot for receiving the perimeter flange.

6. The computer of claim 4 wherein one of the two types of contacts comprises rectangular flanges with bent tabs on their distal ends for wiping contact with the perimeter flange.

7. The computer of claim 1 wherein the tabs extend from the plate and are offset from perpendicular to the plate by an acute angle.

8. The computer of claim 1, further comprising grounding elements extending from the plate into each of the connector apertures.

9. An electromagnetic shield for resisting the passage of electromagnetic emissions in a computer having a rectangular opening with computer side edges, and a computer flange having two surfaces and protruding from each of the computer side edges, the electromagnetic shield comprising:

a rectangular, metallic plate having plate side edges and a plurality of connector apertures, wherein each of the connector apertures are adapted to receive an electrical connector for interconnection with the computer;

a plurality of grounding elements extending from the plate into each of the connector apertures, wherein each of the grounding elements are adapted to engage one of the electrical connectors;

a first series of wiping members on the plate side edges, each of the first series of wiping members being uniform in profile and adapted to slidingly engage a surface of the computer flanges and maintain electrical continuity therewith;

a second series of wiping members on the plate side edges, the second series of wiping members comprising a plurality of opposed contacts that are interleaved and arranged in an alternating pattern to define a slot that is adapted to receive the computer flanges via insertion and grip both surfaces of the computer flanges, wherein the second series of wiping members accommodate translation of the plate when the electrical connectors are inserted into and removed from the connector apertures and maintain electrical continuity along both surfaces of said another one of the computer flanges.

10. The electromagnetic shield of claim 9 wherein the opposed contacts are electrically interconnected to each other.

11. The electromagnetic shield of claim 9 wherein one of the opposed contacts has a folded profile that defines the slot for receiving the computer flanges.

12. The electromagnetic shield of claim 9 wherein each of the wiping members has a proximal end and a distal end; and wherein each wiping member of the first series and one of the contact types of the second series are rectangular flanges with bent tabs on their distal ends.

13. The electromagnetic shield of claim 9 wherein each of the first and second series of wiping members are offset by an acute angle.

14. An electromagnetic shield for resisting the passage of electromagnetic emissions in a computer having a rectangular opening with computer side edges, and a computer flange protruding from each of the computer side edges, each computer flange having two surfaces, the electromagnetic shield comprising:

a rectangular, planar, metallic plate having plate side edges and a plurality of connector apertures, wherein each of the connector apertures are adapted to receive an external electrical connector for interconnection with the computer;

a grounding element extending from the plate into each of the connector apertures, wherein each of the grounding elements are adapted to engage one of the electrical connectors inserted therein;

a plurality of tabs on each of the plate side edges, the tabs extending from the plate at an acute angle, wherein the tabs are adapted to slidingly engage a surface on respective ones of the computer flanges;

a plurality of wiping members with a folded profile on the plate side edges, the wiping members extending from the plate at an acute angle, wherein the wiping members are interleaved with the tabs in an alternating pattern to define slots therebetween for receiving said respective ones of the computer flanges via insertion, the wiping members contacting opposite surfaces of said respective ones of the computer flanges; and wherein the tabs and wiping members accommodate translation of the plate when the electrical connectors are inserted into and removed from the connector apertures and maintain electrical continuity along both surfaces of said respective ones of the computer flanges.

15. The electromagnetic shield of claim 14 wherein the tabs and the wiping members are spaced apart by a slit.

16. The electromagnetic shield of claim 14 wherein the tabs and the wiping members have proximal and distal ends; and wherein the distal end of each tab that is interleaved with a wiping member is flared away from the plate;

the distal end of each of the remaining tabs is flared toward the plate;

the proximal and distal ends of the wiping members are electrically interconnected.

17. The electromagnetic shield of claim 14 wherein said plate side edges having wiping members are located adjacent to each other in an orthogonal orientation.

18. The electromagnetic shield of claim 14 wherein the plate side edges are orthogonal to each other and comprise: a top edge, a bottom edge, a left side edge, and a right side edge; and wherein the wiping members are located on the top edge and the right side edge.

* * * * *